United States Patent
Cowley et al.

(10) Patent No.: US 7,060,619 B2
(45) Date of Patent: Jun. 13, 2006

(54) REDUCTION OF THE SHEAR STRESS IN COPPER VIA'S IN ORGANIC INTERLAYER DIELECTRIC MATERIAL

(75) Inventors: Andy Cowley, Wappinger Falls, NY (US); Erdem Kaltalioglu, Wappinger Falls, NY (US); Mark Hoinkis, Fishkill, NY (US); Michael Stetter, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/379,346

(22) Filed: Mar. 4, 2003

(65) Prior Publication Data

US 2004/0175921 A1    Sep. 9, 2004

(51) Int. Cl.
    *H01L 21/44*    (2006.01)
    *H01L 21/4763*  (2006.01)
(52) U.S. Cl. ............... 438/687; 438/624; 438/626; 438/627; 438/637
(58) Field of Classification Search ........ 438/622–640, 438/687
    See application file for complete search history.

(56) References Cited

U.S. PATENT DOCUMENTS

| | | | |
|---|---|---|---|
| 6,242,808 B1* | 6/2001 | Shimizu et al. | 257/762 |
| 6,342,733 B1 | 1/2002 | Hu et al. | |
| 6,376,353 B1* | 4/2002 | Zhou et al. | 438/612 |
| 6,475,909 B1* | 11/2002 | Uozumi | 438/678 |
| 6,573,604 B1* | 6/2003 | Kajita | 257/758 |
| 6,670,274 B1* | 12/2003 | Liu et al. | 438/692 |
| 6,777,323 B1* | 8/2004 | Kakamu | 438/633 |
| 6,893,959 B1* | 5/2005 | Barth | 438/637 |
| 2001/0013617 A1 | 8/2001 | Toyoda et al. | |
| 2002/0074664 A1 | 6/2002 | Nogami et al. | |
| 2004/0224497 A1* | 11/2004 | Barth | 438/687 |

OTHER PUBLICATIONS

Segawa et al. ["Manufacturing ready selectivity of CoWP Capping on Damascene Copper Interconnects" Advanced Process R&D Laboratories, Semiconductor Network Company Conference Proceedings ULSI XVIII 2002, Material Research Society, pp. 567-572].*

* cited by examiner

*Primary Examiner*—Thanhha Pham
(74) *Attorney, Agent, or Firm*—Slater & Matsil, L.L.P.

(57) ABSTRACT

Interconnect layers on a semiconductor body containing logic circuits (microprocessors, Asics or others) or random access memory cells (DRAMS) are formed in a manner to significantly reduce the number of shorts between adjacent conductor/vias with narrow separations in technologies having feature sizes of 0.18 microns or smaller. This is accomplished by etching to form recessed copper top surfaces on each layer after a chemical-mechanical polishing process has been completed. The thickness of an applied barrier layer, on the recessed copper surfaces, is controlled to become essentially co-planar with the surrounding insulator surfaces. A thicker barrier layer eliminates the need for a capping layer. The elimination of a capping layer results in a reduction in the overall capacitive coupling, stress, and cost.

16 Claims, 8 Drawing Sheets

REDUCTION OF THE SHEAR STRESS IN COPPER VIA'S IN ORGANIC INTERLAYER DIELECTRIC MATERIAL

FIELD OF THE INVENTION

This invention relates to integrated circuit devices using copper for interconnecting discrete circuit components as part of the processing of semiconductor silicon bodies, and more particularly, to modifications in body processing resulting in a reduction of electrical shorts between metal lines and vias with high aspect ratios and narrow spaces.

BACKGROUND OF THE INVENTION

As the Ultra Large Scale (ULSI) circuit density increases and device features sizes become 0.18 microns or less, increased numbers of patterned metal levels are required with decreasing spacing between metal lines at each level to effectively interconnect discrete semiconductor devices on the semiconductor chips. Typically the different levels of metal interconnections are separated by layers of insulator material. These interposed insulating layers have etched holes which are used to connect one level of metal to the next. Typically, the insulating layer is silicon oxide ($SiO_2$) having a dielectric constant k (relative to vacuum) of about 4.0 to 4.5.

However, as the device dimensions decrease and the packing density increases, it is necessary to reduce the spacing between the metal lines at each level of interconnections to effectively wire up the integrated circuits. Unfortunately, as the spacing decreases, the intralevel and interlevel capacitances increase between metal lines since the capacitance C is inversely proportional to the spacing d between the lines. Therefore, it is desirable to minimize the dielectric constant k in the insulator (dielectric) between the conducting lines to reduce the RC time constant and thereby increase the performance of the circuit (frequency response) since the signal propagation time in the circuit is adversely affected by the RC delay time.

To achieve an insulating layer with a dielectric constant of 3 or less, relatively porous spin-on insulating films are commonly used, such as hydrogen silsequioxane (a silicon polymer) (HSQ) with a k of 2.7–3.0 and SiLK™ (A trademark of the Dow Chemical Company) with a k of 2.65. However, these low-k insulators (low compared to silicon oxide) are usually very porous and therefore do not provide good structural support for integration. Further, absorbed moisture and other chemicals in the porous insulator can cause corrosion of the metal lines.

Low k materials, such as, Black Diamond™ (A trademark of Applied Materials), Coral™ (A trademark of Novellus), SiCOH and other similar materials are used in the semiconductor industry but are deposited by CVD which distinguish them from the spin-on dielectrics.

Copper is the preferred metal that is used on chip multi-level interconnections (both wiring and plugs) to replace aluminum which has a higher bulk electrical resistivity and a low resistance to electromigration. Copper can be deposited by either electrolytic or electroless deposition and also by Chemical Vapor Deposition (CVD) and Physical Vapor Deposition (PVD).

Copper has relatively poor resistance to corrosion. Unlike other metal oxidation (such as aluminum oxidation), copper is readily oxidized to form $Cu_2O$ and CuO at relatively low temperatures (below 200° C.) and no self protective oxide layer forms to prevent the copper from further oxidation. Oxidized copper degrades the electrical and mechanical properties of the copper interconnect. Accordingly, a protection (or encapsulation) layer of high corrosion resistance material is necessary to cover exposed copper surfaces.

A variety of materials are known for forming diffusion barriers on copper. Such materials include, Ta, W, Mo, TiW, TiN, TaN, WN, TiSiN and TaSiN, which can be deposited by CVD or PVD. More recently, electrolessly deposited CoWP has been used as a barrier material to encapsulate a conductor material Furthermore, the W in the CoWP significantly enhances the barrier properties.

However, in very narrow spaces like those found between first level metal lines in 0.18 or less micron technologies, as the cap layer is selectively deposited onto the exposed copper of the previously planarized surface there is some lateral (sideways) growth which is proportional to the thickness of the selectively deposited layer. When the lateral growth exceeds half the distance between copper lines the cap layer can make contact with the adjacent cap layer to create an electrical short. Therefore, in some technologies a very thin layer of CoWP, proposed to achieve an improvement in electromigration, would be less prone to form electrical shorts. But an extremely thin layer is insufficient as a copper diffusion barrier and therefore, an additional cap layer of, for example, SiN or Blok (a barrier low k insulator material developed by Applied Materials, Inc.) is still required.

SUMMARY OF THE INVENTION

The above-mentioned problem, in which an insufficiently thick CoWP layer fails as a diffusion barrier to copper (Cu), necessitates the use of an additional cap layer. The present invention addresses a method for eliminating the cap layer and, thereby improves the overall circuit performance. Improved circuit performance is the result of a reduction in: capacitive coupling, thermo-mechanical stress and thermal budget. The thermal budget reduction is the result of a decrease in the number of processing steps which leads to lower processing costs. It is to be noted that low k dielectrics can be either organic (e.g., SiLK) or inorganic (e.g., HSQ) and therefore, the term "low k dielectrics" will be used to refer to both organic and inorganic low k insulators. This term does not include materials, such as, $SiO_2$ or $Si_3N_4$ which have k values of about 4 and 8, respectively.

Viewed from a first method aspect, the present invention includes a method of forming conductors over a semiconductor body having a top surface in which electrical contact areas are formed. The method comprises the steps of: forming a first inorganic insulating layer having a relatively high k over the top surface; forming vias completely through the first inorganic insulating layer which are in contact with the contact areas; filling the vias through the first inorganic insulating layer with conductive material to form conductive plugs which contact the contact areas; forming a first dielectric insulating layer having a relatively low k over the first inorganic insulating layer; forming trenches in the first dielectric layer from a top surface thereof; lining the vias and trenches in the first dielectric insulating layer with a conductive barrier liner layer; filling the vias and trenches in the first dielectric insulating layer with copper to at least a level of a top surface of the first dielectric insulating layer; removing a portion of the copper fill in the vias and trenches so as to recess the copper in the vias and trenches from the top surface of the first dielectric insulating layer; forming a conductive barrier layer on a top surface of the copper in the vias and trenches, said conductive barrier layer having a top surface which is essentially planar with the top surface of the first low k dielectric layer; forming a second dielectric insulating layer having a relatively low k and being of the same type as the first dielectric insulating layer over the first dielectric insulating layer; forming vias and trenches in the second dielectric insulating layer and lining same with a conductive barrier liner layer, copper filling, copper recessing, and forming barrier layers over the recessed copper in essentially the same manner as was done with respect to the first dielectric insulating layer; and forming a second inorganic layer having a relatively high k over a top surface of the last of the additional plurality of the dielectric insulating layers.

Viewed from a second method aspect, the present invention includes a method of forming conductors over a semiconductor body having a top surface in which electrical contact areas are formed. The method comprises the steps of: forming a first silicon oxide layer over the top surface of the semiconductor body; forming vias completely through the first silicon oxide layer which are in contact with the contact areas; filling the vias through the first silicon oxide layer with conductive material to form conductive plugs which contact the contact areas; forming a first insulating layer having a lower k than silicon oxide over the first silicon oxide layer; forming trenches in the first insulating layer from a top surface thereof; lining the vias and trenches in the first insulating layer with a barrier conductive liner layer; filling the vias and trenches in the first insulating layer with copper to at least a level of a top surface of the first insulating layer; removing a portion of the copper fill in the vias and trenches so as to recess the copper in the vias and trenches from the top surface of the first insulating layer; applying a conductive activation layer over top surfaces of the recessed copper; forming a conductive barrier layer over the conductive activation layer, said barrier layer having a top surface which is essentially planar with the top surface of the first insulating layer; forming a second insulating layer of the same type as the first insulating layer over the first insulating layer; forming vias and trenches in the second insulating layer and lining same with a conductive barrier liner layer, copper filling, copper recessing, and forming barrier layers over the recessed copper in essentially the same manner as was done with respect to the first insulating layer; and forming a second silicon oxide layer over a top surface of the second insulating layer.

The invention will be better understood from the following more detailed description taken in conjunction with the accompanying drawings and claims.

BRIEF DESCRIPTION OF THE DRAWINGS

The drawings are not necessarily to scale.

DETAILED DESCRIPTION

In this specification processes are described which bear on the elimination of an inorganic cap layer by recessing the surface of the copper conductors and vias to provide for a thicker, conducting diffusion barrier while still maintaining the overall thickness requirements for the metal/insulator stack.

It is to be noted that low k dielectrics can be either organic (i.e. SiLK) or inorganic (i.e. HSQ) and therefore, the term "low k dielectrics" will be used to refer to both organic and inorganic low k insulators. This term does not include materials, such as, $SiO_2$ or $Si_3N_4$ which have k values of about 4 and about 8, respectively.

Figure 1:
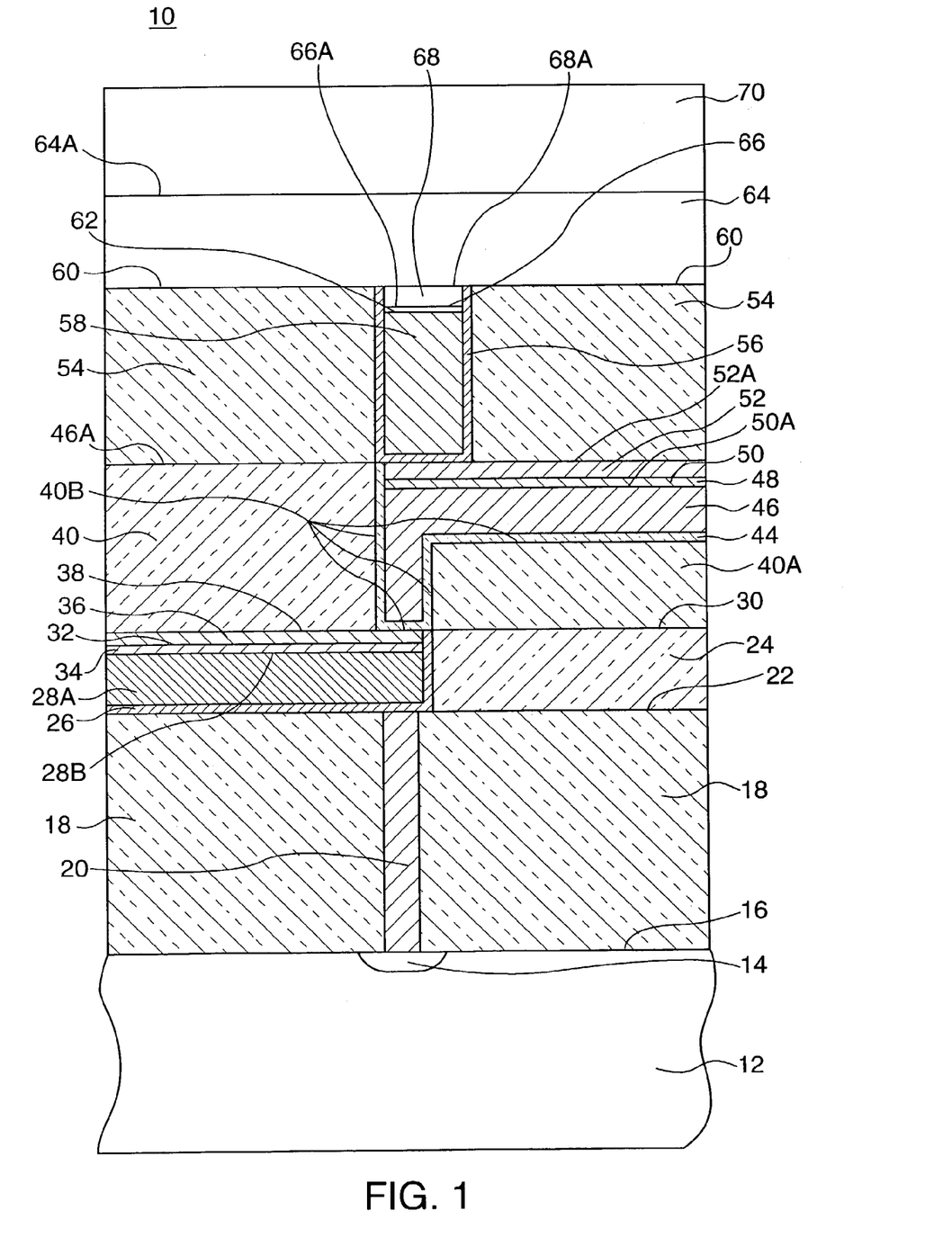
FIG. 1 illustrates a cross-section of an integrated circuit fabricated using both single and dual Damascene processes in accordance with the present invention.

FIG. 1 shows a cross-sectional view of a semiconductor structure 10 which comprises a plurality of logic circuitry of a microprocessor or ASIC, or, alternatively, memory cells of a dynamic random access memory (DRAM) represented by a drain region 14 formed in a semiconductor body 12 in accordance with a preferred embodiment of the present invention. A first insulating (Pre-Metal Dielectric, PMD) layer 18, typically of silicon oxide ($SiO_2$) is deposited onto a silicon surface 16 of semiconductor body 12 and is patterned, lithographically, to form contact openings (not shown) which are overfilled with a first conducting layer 20, typically tungsten (W), which becomes the contact metallurgy to the semiconductor drain region 14. The surface is planarized using chemical-mechanical polishing (CMP) to result in an essentially planar surface 22. A low k dielectric insulating (Inter-Metal Dielectric, IMD) layer 24, from one of a group of materials with a low dielectric constant, typically about 3.7 or less, is deposited over the first inorganic insulating layer 18. A single Damascene process is used to form openings (not shown) in insulating layer 24 and the openings(trenches) are lined with a second conductor material 26, typically, of tantalum nitride (TaN) or titanium nitride (TiN). The lined openings are filled with a third conductor material 28A, typically Cu, to form conductors and to make contact to the first conductor layer 20. The surface is then planarized using CMP to form surface 30. The exposed copper layer 28A is etched to result in a recessed top surface 28B. A catalytic layer 34, typically of palladium (Pd), is deposited over the copper top surface 28B to provide a catalytically activated copper surface. A barrier layer 36, typically, of cobalt tungsten phosphide (CoWP), is deposited selectively, electrolessly, onto a surface 32 of the Pd layer to form a surface 38 which is essentially co-planar with surface 30. The barrier layer 36 can be selected from at least one of the group consisting of CoWP, CoP, Co, Ni, NiP, W, Ru, Mo, Cr, Re, V, Mn, Zn, Sn, Pb, and any combination of the previously recited materials which is suitable to work as a Cu diffusion barrier. An optional touch-up CMP process can be used to remmove any excess condcutive barrier material on top of the copper line and activation layer or to remove any unintentionally deposited barrier material on top of the dielectric layer. A low k dielectric insulating layer 40, one of a group of materials with a low dielectric constant, typically k equals about 3.7 or less, is deposited over the resulting structure. Layer 40 is etched to form a dual Damascene structure with both trench and via hole openings (not shown) having surfaces 40B which are covered with a liner layer 44, typically, of TaN TiN, WN or other similar materials. The trench and hole openings are then overfilled with Cu 46, and the surface is planarized using CMP. The exposed copper layer (not shown) is etched to form a recessed top surface 50A. A catalytic layer 48, typically of palladium (Pd), is deposited over the copper surface 50A. The Pd activation layer 48 is then covered, selectively and electrolessly, with a conductive barrier layer 52, typically of CoWP. An optional touch-up CMP step can be performed after the CoWP deposition to remove all CoWP overgrowth and CoWP islands (spots) on top of the dielectric surface. It is, however, recommended that a CoWP layer >10 nm thick remains in the recessed areas above the copper line. A surface 52A of the layer 52 is then essentially co-planar with the low k dielectric insulator layer surface 46A. A low k dielectric insulating material with a dielectric constant, typically about 3.7 or less, is deposited to form a layer 54 into which a via opening (not shown) is etched. The via opening is lined with a conductor material 56, typically TaN or TiN. This opening is then overfilled with layer 58, typically of copper, and the surface is planarized using CMP. The exposed copper is etched to form a recessed top surface 62. A catalytic layer 66, typically of Pd, is deposited onto the top surface 62 layer 66 has a top surface 66A. A conductive barrier layer 68 is then deposited, selectively and electrolessly, onto the surface 66A forming a top surface 68A which is essentially co-planar with surface 60. A second layer 64, typically of $SiO_2$, is deposited onto the resulting structure and a third inorganic layer 70, typically of $Si_3N_4$, is deposited onto the surface 64A. Conducting vias (not shown) are formed through layers 64 and 70 and in other layers as required to facilitate electrical contact with terminals (not shown) on a package in which the semiconductor structure 10 is housed.

Figure 2:
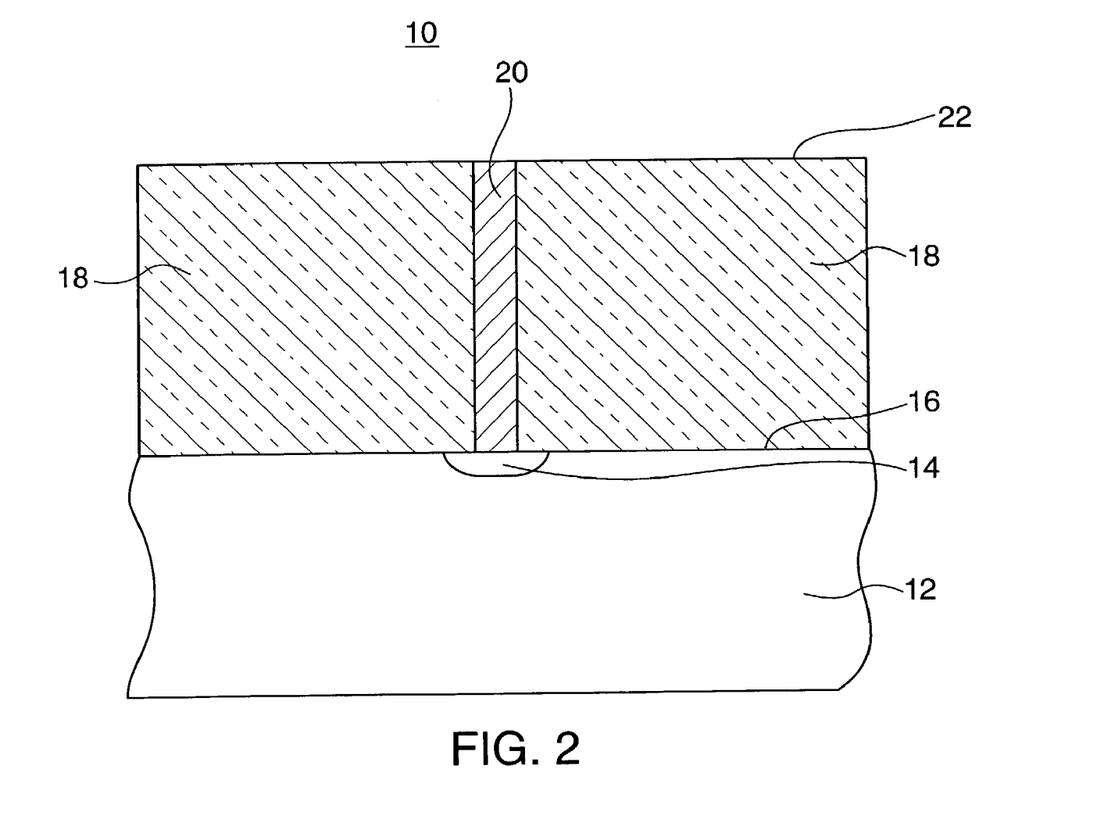
FIGS. 2–8 illustrate cross-sections of integrated circuits in which processing methods are used in accordance with the present invention.

FIG. 2 shows a cross-sectional view of a semiconductor structure 10 at an early stage of fabrication with the drain region 14 formed in a semiconductor body 12. A first inorganic insulating layer 18, typically, of silicon oxide ($SiO_2$) or of boron phosphosilicate glass (BPSG), typically 200 nm–1000 nm thick, is deposited onto a silicon surface 16 of semiconductor body 12 and is patterned, lithographically, to form contact openings (not shown) which are overfilled with a first conducting layer 20, typically tungsten (W), which becomes the contact metallurgy to the semiconductor drain region 14. The surface is planarized using chemical-mechanical polishing (CMP) to form a top surface 22.

Figure 3:
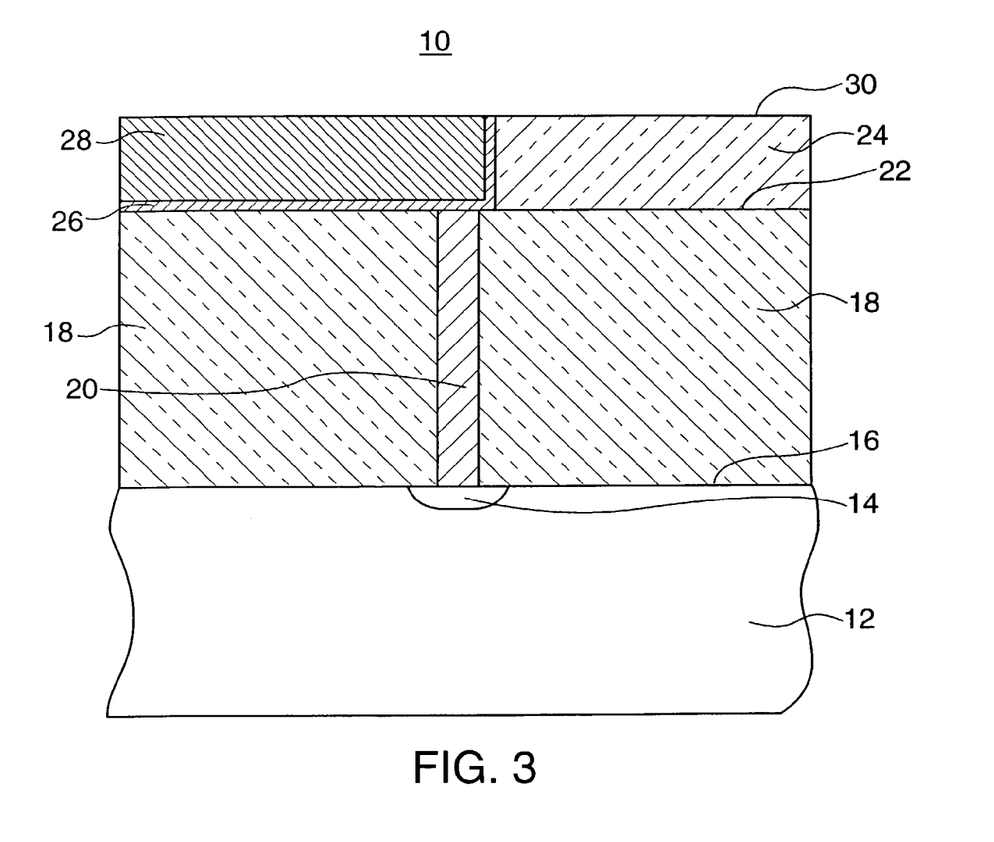

FIG. 3 shows a cross-sectional view of a semiconductor structure 10 in which an insulating layer 24, (from one of a group of low k dielectric materials having a dielectric constant, typically about 3.7 or less), is deposited or spun onto the surface of the semiconductor body 12. A single Damascene process is used to form openings (not shown) in layer 24 and the openings are lined with a second conducting layer 26 consisting of one of a class of materials which acts as a barrier layer to the diffusion of Cu, typically, of tantalum nitride (TaN) or titanium nitride (TiN).

The opening (trench), lined with layer 26, is overfilled with a third conducting layer 28, typically, of copper (Cu), to form conductors and to make contact to the first conductor layer 20. A resulting surface is planarized using CMP to form the surface 30.

Figure 4:
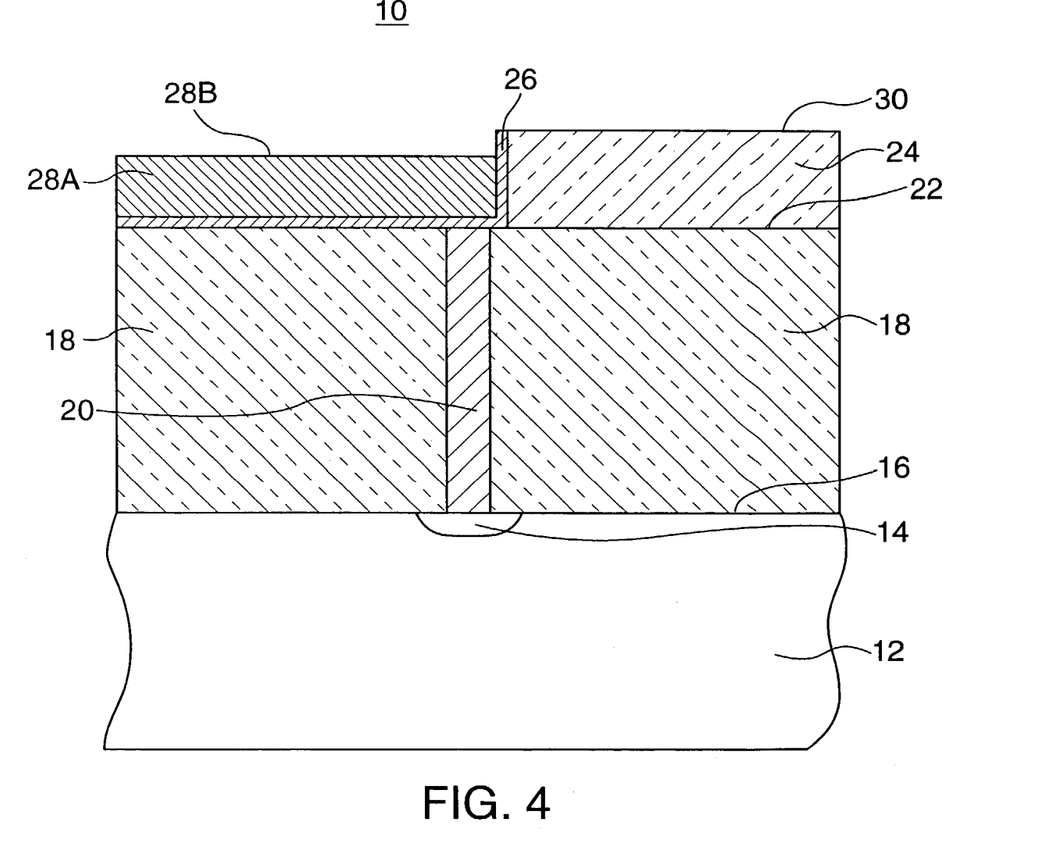

FIG. 4 shows a cross-sectional view of a semiconductor structure 10 in which the Cu layer 28 is etched to form a recessed layer 28A, 10–20 nm deep, having a top surface 28B. The liner layer 26 will be left intact if a wet chemical etch, typically of ammonium persulfate, is used since it has a good selectivity for Cu whereas, the liner layer 26 will be partially or completely removed if a reactive ion etch (RIE) is used.

Figure 5:
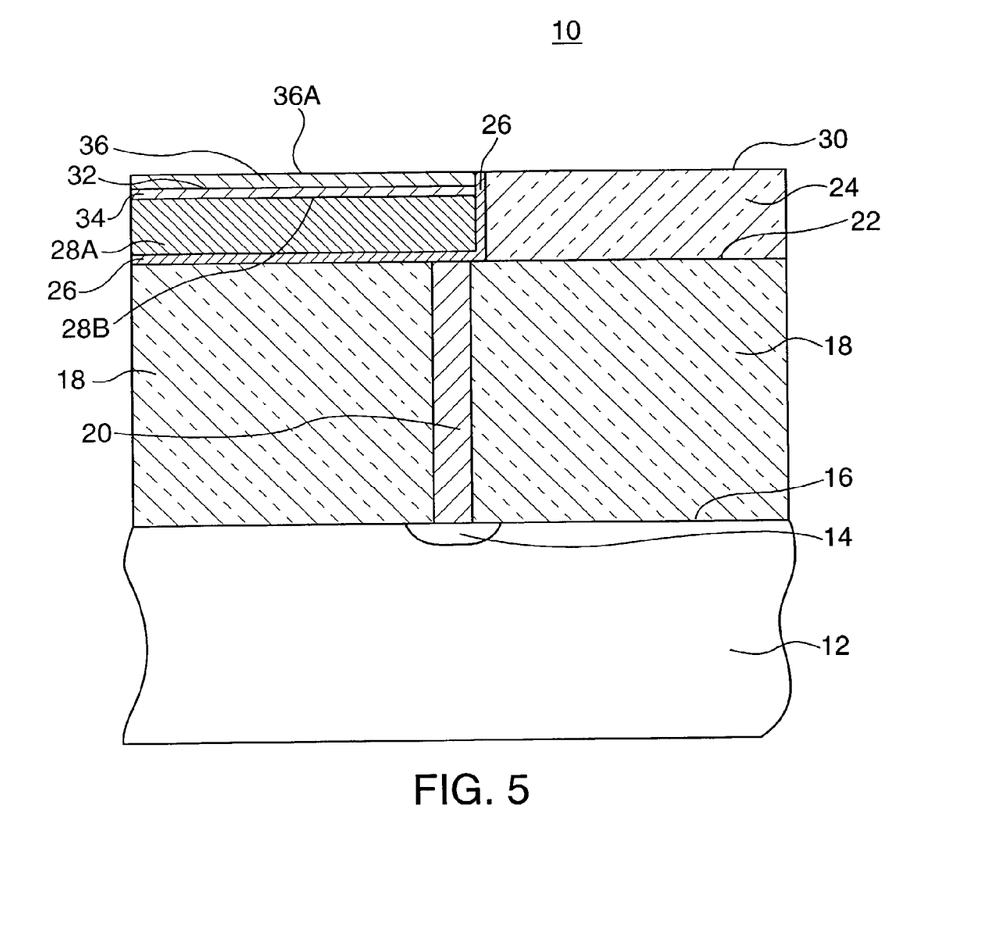

FIG. 5 shows a cross-sectional view of a semiconductor structure 10 in which the top surface 28B of the recessed Cu layer 28A is covered with a catalytic activation layer 34, typically, of palladium (Pd), approximately one to three atom layers thick, which is useful to activate the Cu surface. A conductive barrier layer 36, typically of cobalt-tungsten-phosphide (CoWP), is then deposited onto the top surface of the palladium layer 34 by selective, electroless, deposition. The CoWP surface 36A is essentially co-planar with the surface 30 of insulator layer 24.

Figure 6:
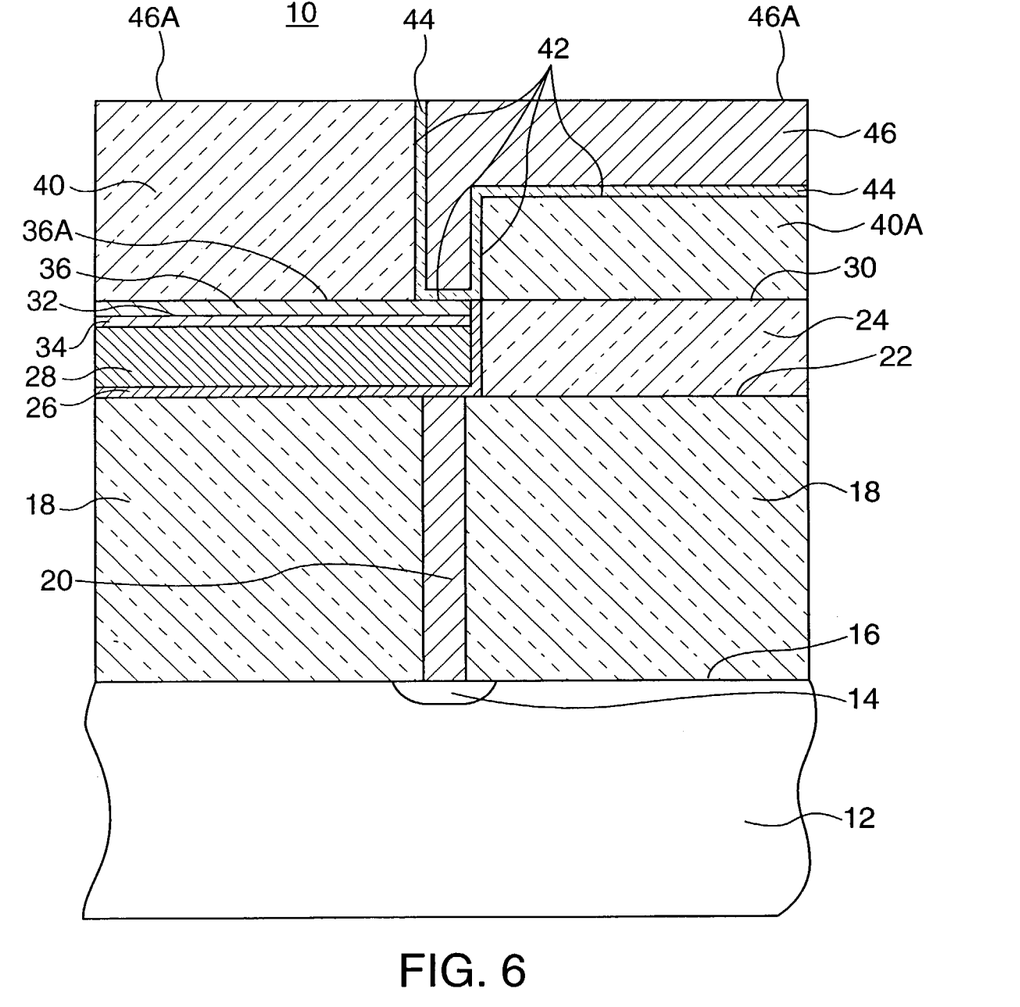

FIG. 6 shows a cross-sectional view of a semiconductor structure 10 in which a layer 40, (a low k dielectric material with a dielectric constant, typically about 3.7 or less), is deposited onto the essentially planar surfaces 30 and 36A. Layer 40 is etched to form a Dual Damascene structure resulting in both a via and trench opening (not shown) thereby creating new surfaces 42 on modified layer 40. The surfaces 42 are covered, conformally, with a liner layer 44, typically, of TaN or TiN. The via and trench openings (not shown) are then overfilled with a Cu layer 46 and the surface is planarized using CMP to form a top surface 46A.

Figure 7:
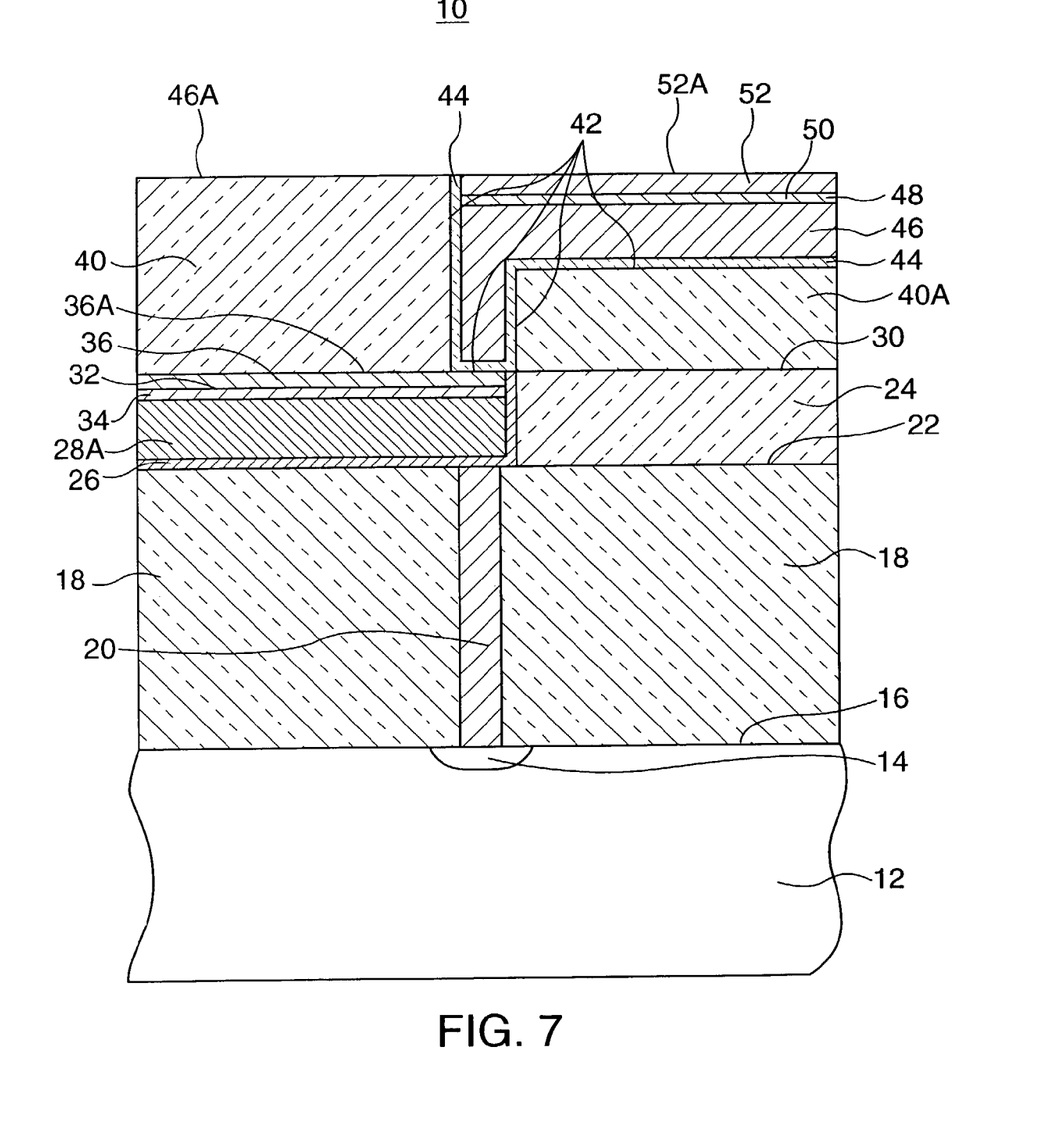

FIG. 7 shows a cross-sectional view of a semiconductor structure 10 in which the Cu layer 46 is etched, typically, with a wet etch of ammonium persulfate, to form a recessed surface 48 in the Cu layer 46. An activation layer 50, typically of Pd, one to three atom layers thick, is then deposited to cover the recessed Cu surface 48. A layer 52, typically of cobalt tungsten phosphide (CoWP), is selectively, and electrolessly deposited onto layer 50 to form a new surface 52A. The thickness of CoWP layer 52 makes the surface 52A essentially co-planar with the surface 46A of layer 40.

Figure 8:
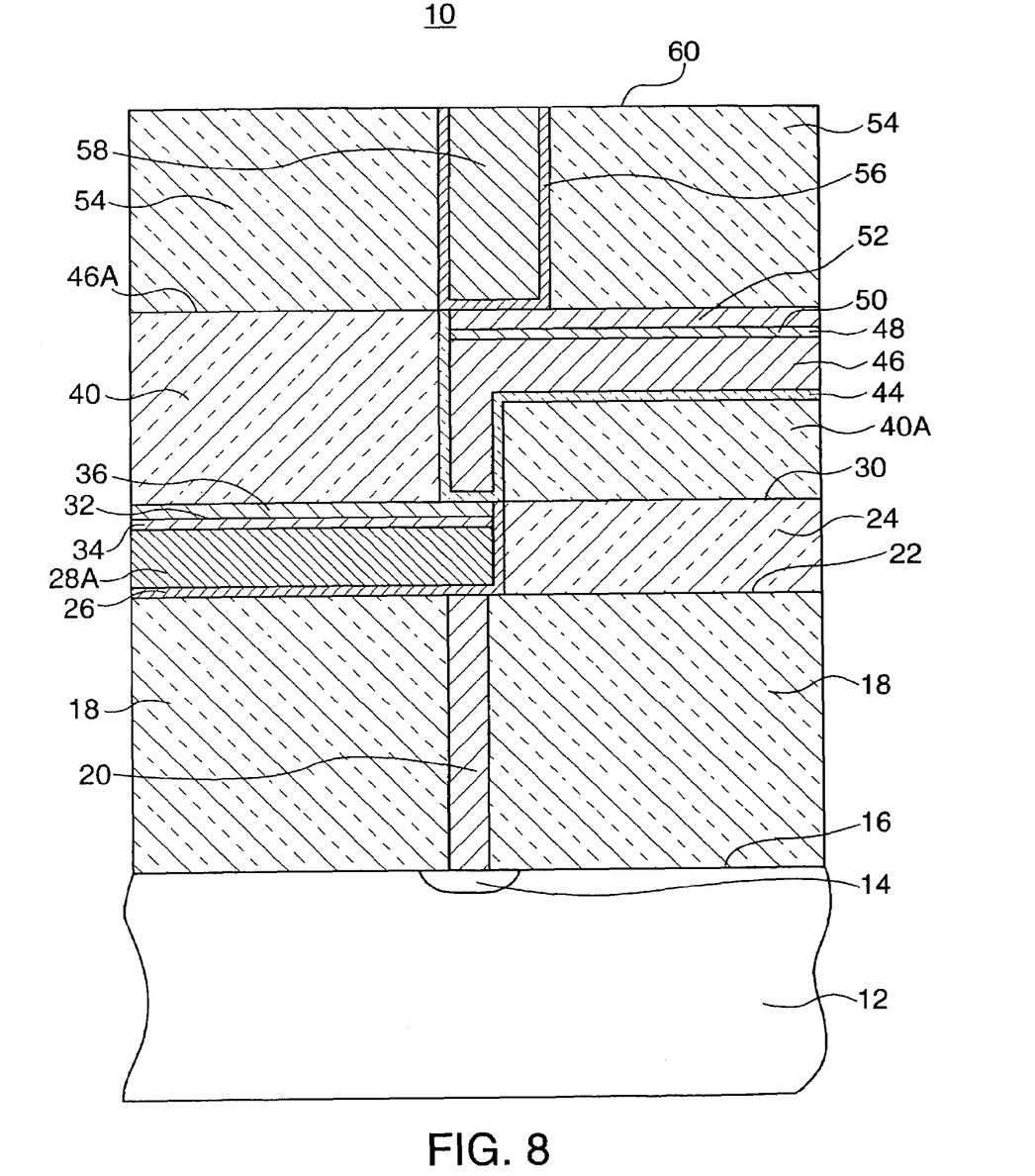

FIG. 8 shows a cross-sectional view of a semiconductor structure 10 in which the surface 46A is covered with a layer 54 using a material which is one of a group of low k dielectric materials having a dielectric constant, typically of about 3.7 or less. A via (not shown) is formed in layer 54 and is then lined with a layer 56 of a conductor material, typically, of TaN or TiN. The via is then overfilled with Cu 58 and the surface is planarized with CMP to form surface 60.

FIG. 1 shows the resulting semiconductor structure 10 after the Cu via fill 58 has been recessed, 10–20 nm, by wet or dry etch. The Cu surface 62 is covered with an activation layer 66, typically of Pd, which forms surface 66A. A layer 68, typically of CoWP is selectively and electrolessly deposited onto Pd surface 66A to a thickness which makes the surface coplanar with surface 60. An inorganic insulator layer 64, typically of $SiO_2$, is then deposited onto surface 60. This is followed by the deposition of a second inorganic, insulating layer 70, typically of silicon nitride ($Si_3N_4$), onto surface 64A. Vias and trenches are formed into layers 64 and 70 and conductors are then formed in the vias and trenches to facilitate electrical contact with terminals on a package in which the semiconductor structure 10 is housed.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming conductors over a semiconductor body having a top surface in which electrical contact areas are formed comprising the steps of:
   forming a first inorganic insulating layer having a first value of k over the top surface;
   forming vias completely through the first inorganic insulating layer which are in contact with the contact areas;
   filling the vias through the first inorganic insulating layer with conductive material to form conductive plugs which contact the contact areas;
   forming a first dielectric insulating layer having a second value of k over the first inorganic insulating layer, said second value of k being lower than said first value of k;
   forming trenches in the first dielectric insulating layer from a top surface thereof;
   lining the trenches in the first dielectric insulating layer with a conductive barrier liner layer;

filling the trenches in the first dielectric insulating layer with copper to at least a level of a top surface of the first dielectric insulating layer;

removing a portion of the copper fill in the trenches so as to recess the copper in the trenches from the top surface of the first dielectric insulating layer;

applying a conductive activation layer of Pd over the top surface of the recessed copper;

electrolessly and selectively depositing a conductive barrier layer over the conductive activation layer in the trenches, said conductive barrier layer having a top surface which is essentially planar with the top surface of the first dielectric insulating layer, the conductive barrier layer on the top surface of the recessed copper selected from a group consisting of CoP, Co, Ni, NiP, W, Ru, Mo, Cr, Re, V, Mn, Zn, Sn, Pb, and combinations thereof, to work as a Cu diffusion barrier;

forming a second dielectric insulating layer having the second value of k over and directly contact with the first dielectric insulating layer;

forming vias and trenches in the second dielectric insulating layer and lining same with a conductive barrier liner layer, copper filling, copper recessing, conductive activation applying, and forming a conductive barrier layer over a conductive activation layer as was done with respect to the first dielectric insulating layer; and forming a second inorganic insulating layer having a relatively high k over a top surface of the second dielectric insulating layer.

2. The method of claim 1 wherein the first and second inorganic insulating layers have a k of 3.7 or greater and the first and second dielectric insulating layers have a k of 3.7 or less.

3. The method of claim 2 wherein the first and second inorganic insulating layers are each selected from a group consisting of silicon oxide, boron-doped oxide (BSG), phosphorus-doped oxide (PSG), boron and phosphorus-doped oxide (BPSG), and Fluorine-doped oxide (PSG).

4. The method of claim 1 wherein the conductive material filling the vias in the first inorganic layer is tungsten.

5. The method of claim 1 wherein the conductive barrier liner layers are selected from a group consisting of at least one of a group consisting of Ta, W, Mo, TiW, TiN, TaN, WN, TiSiN, and TaSiN.

6. The method of claim 1 wherein the copper is deposited electrolytically.

7. The method of claim 1 wherein the copper is deposited by electrodeposition, CVD and PVD.

8. The method of claim 1 in which the copper over fills the vias and trenches and is planarized to the level of the top surface of the second dielectric insulating layer by chemical-mechanical polishing.

9. The method of claim 1 wherein the step of removing a portion of the copper is achieved by etching in an aqueous copper etching solution.

10. The method of claim 1 wherein the step of removing a portion of the copper is achieved by reactive ion etching.

11. The method of claim 1 further comprising a touch up CMP to the conductive barrier layer.

12. The method of claim 1 further comprising the steps of:
forming a plurality of additional dielectric insulating layers of the same dielectric constant as the first dielectric insulating layer over the second dielectric insulating layer; and
forming vias and trenches in the plurality of additional dielectric layers and lining with a conductive barrier liner layer, copper filling, copper recessing, conductive activation applying, and forming a conductive barrier over a conductive activation layer as was done with respect to the first dielectric insulating layer.

13. The method of claim 12 wherein each of the additional dielectric insulating layers has a k of about 3.7 or less.

14. A method of forming conductors over a semiconductor body having a top surface in which electrical contact areas are formed comprising the steps of:
forming a first silicon oxide layer over the top surface of the semiconductor body;
forming vias completely through the first silicon oxide layer which are in contact with the contact areas;
filling the vias through the first silicon oxide layer with conductive material to form conductive plugs which contact the contact areas;
forming a first insulating layer having a lower k than silicon oxide over the first silicon oxide layer;
forming trenches in the first insulating layer from a top surface thereof;
lining the trenches in the first insulating layer with a conductive barrier liner layer;
filling the trenches in the first insulating layer with copper to at least a level of a top surface of the first insulating layer;
removing a portion of the copper fill in the trenches so as to recess the copper in the trenches from the top surface of the first insulating layer;
applying a conductive activation layer over top surfaces of the recessed copper;
forming a conductive barrier layer over the conductive activation layer, said conductive barrier layer having a top surface which is essentially planar with the top surface of the first insulating layer, the conductive barrier layer on the top surface of the recessed copper selected from a group consisting of CoP, Co, NiP, W, Ru, Mo, Cr, Ref, V, Mn, Zn, Sn, Pb, and combinations thereof;
forming a second insulating layer having the same dielectric constant as the first insulating layer over and directly contact with the first insulating layer;
forming vias and trenches in the second insulating layer and lining same with a conductive barrier liner layer, copper filling, copper recessing, conductive activation applying, and forming a conductive barrier layer over a conductive activation layer as was done with respect to the first insulating layer; and
forming a second silicon oxide layer over a top surface of the second insulating layer.

15. The method of claim 14 further comprising the steps of:
forming a plurality of additional insulating layers of the same dielectric constant as the first and second insulating layers over the second insulating layer and below the second silicon oxide layer; and
forming vias and trenches in the plurality of additional insulating layers and lining each with a conductive barrier liner, copper filling, copper recessing, conductive activation applying, and forming barrier layers over a conductive activation layer as was done with respect to the second insulating layer.

16. The method of claim 14 further comprising the step of forming a silicon nitride layer over the second silicon oxide layer.

* * * * *

UNITED STATES PATENT AND TRADEMARK OFFICE
CERTIFICATE OF CORRECTION

PATENT NO. : 7,060,619 B2  
APPLICATION NO. : 10/379346  
DATED : June 13, 2006  
INVENTOR(S) : Cowley et al.

It is certified that error appears in the above-identified patent and that said Letters Patent is hereby corrected as shown below:

Column 7, line 25; delete "over a conductive" insert --over the conductive--

Signed and Sealed this

Twenty-first Day of November, 2006

JON W. DUDAS  
*Director of the United States Patent and Trademark Office*